United States Patent
Chiba

[19]

[11] Patent Number: 6,100,585

[45] Date of Patent: Aug. 8, 2000

[54] STRUCTURE FOR MOUNTING DEVICE ON CIRCUIT BOARD

[75] Inventor: Taneaki Chiba, Tokyo, Japan

[73] Assignee: NEC Corporation, Tokyo, Japan

[21] Appl. No.: 09/079,327

[22] Filed: May 14, 1998

[30] Foreign Application Priority Data

May 20, 1997 [JP] Japan .................................. 9-130148

[51] Int. Cl.[7] .................................................. H01L 23/48
[52] U.S. Cl. .......................... 257/734; 257/700; 257/697
[58] Field of Search .................................... 361/790, 760; 257/697, 734, 700

[56] References Cited

U.S. PATENT DOCUMENTS

| | | | |
|---|---|---|---|
| 5,481,435 | 1/1996 | Werther | 257/697 |
| 5,561,594 | 10/1996 | Wakefield | 361/760 |
| 5,825,630 | 10/1998 | Taylor et al. | 361/790 |

*Primary Examiner*—Roy Potter
*Attorney, Agent, or Firm*—Laff, Whitesel & Saret, Ltd.

[57] ABSTRACT

A structure for mounting a device on a circuit board, comprising two relay substrates provided parallel to each other between the circuit board and the device, one of the relay substrates being constituted by a relay socket substrate with an array of socket pins being inserted into and supported by the relay socket substrate, each of the socket pins being soldered to a corresponding one of solder pads in the circuit board, the other relay substrate being constituted by a relay pin substrate with an array of relay pins, for connection to the device, being inserted into and supported by the relay pin substrate, each of the relay pins being soldered to a corresponding one of solder balls provided in the device, the relay pins, in the relay pin substrate, each in its one end opposite to the soldered end being detachably fitted in the socket pins each in its one end on the socket side. This construction enables repair and replacement of the device and the evaluation and tests of the performance of the device.

4 Claims, 2 Drawing Sheets

STRUCTURE FOR MOUNTING DEVICE ON CIRCUIT BOARD

FIELD OF THE INVENTION

This invention relates to a structure for mounting a device on a circuit board, and more particularly to a structure for mounting a device on a circuit board which is suitable for mounting surface mounting LSI on a printed board.

BACKGROUND OF THE INVENTION

In recent years, an enhancement in the function of the device has lead to a change in the structure for mounting a device on a circuit board from a structure, for mounting a device, utilizing through-holes provided in the circuit board to PGA (pin grid array) having a large number of terminal pins on the bottom of a chip, QFP (quad flat package) wherein connection terminals are protruded around a device, PLCC (plastic leaded chip carrier), and other structures.

At the present time, a structure, for mounting a device, called BGA (ball grid array) having connection solder balls provided on the bottom of the device is widely known in the art.

A conventional structure for mounting a device on a circuit board comprises a semiconductor device having an array of solder balls on a back surface, and a printed circuit board having an array of terminals on a top surface, wherein each of the solder balls is connected to a corresponding one of the terminals in accordance with the solder-reflow process.

In the conventional structure for mounting a device on a circuit board, however, there are disadvantages in that once the device is mounted on the circuit board, the device cannot be separated from the circuit board, making it impossible to repair or replace the device, and in that, since the device is constructed so as to cover the terminals of the circuit board, a wiring pattern to be connected to the terminals cannot be lead onto the mounting surface of the circuit board, so that signals for the evaluation of the performance of the device or the test of the device cannot be input into and output from the device.

SUMMARY OF THE INVENTION

Accordingly, an object of the present invention is to provide a structure for mounting a device on a circuit board which enables the device to be repaired or replaced and, in addition, the device to be evaluated for performance or to be tested.

According to the first feature of the invention, a structure for mounting a device on a circuit board, comprises:

a semiconductor device having an array of solder balls;

an array of first conductive members supported by a first insulative substrate, each of said first conductive members being connected to a corresponding one of first ends of said solder balls;

an array of second conductive members supported by a second insulative substrate, each of first ends of second conductive members being connected to a corresponding one of second ends of said first conductive members in accordance with a connectable and deconnectable structure; and a printed circuit board having an array of solder pads, each of second ends of said second conductive members being connected to a corresponding one of said solder pads.

According to the second feature of the invention, a structure for mounting a device on a circuit board, comprises:

two relay substrates provided parallel to each other between the circuit board and the device, one of the relay substrates being constituted by a relay socket substrate with an array of socket pins being inserted into and supported by the relay socket substrate, each of the socket pins being soldered to a corresponding one of terminals in the circuit board, the other relay substrate being constituted by a relay pin substrate with an array of relay pins, for connection to the device, being inserted into and supported by the relay pin substrate, each of the relay pins being soldered to a corresponding one of terminals in the device, the relay pins, in the relay pin substrate, each in its one end opposite to the soldered end being detachably fitted in the socket pins each in its one end on the socket side.

BRIEF DESCRIPTION OF THE DRAWINGS

The invention will be explained in more detail in conjunction with appended drawings, wherein.

DESCRIPTION OF THE PREFERRED EMBODIMENTS

Before explaining a structure for mounting a device on a circuit board in the first preferred embodiment according to the invention, the aforementioned conventional structure for mounting a device on a circuit board will be explained in FIG. 1.

Figure 1:
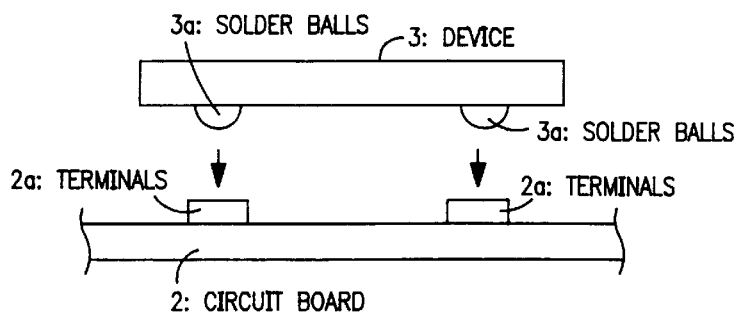
FIG. 1 is an exploded front view of a conventional structure for mounting a device on a circuit board.

In FIG. 1, a structure 1 for mounting a device comprises: a semiconductor device 3 having on its back surface an array of solder balls 3a, and a printed circuit board 2 having on its top surface an array of terminals 2a, wherein each of the solder balls 3a is connected to a corresponding one of the terminals 2a in accordance with the solder-reflow process.

In the conventional structure 1 for mounting a device on a circuit board, however, there are disadvantages in that once the device 3 is mounted on the circuit board 2, the device cannot be separated from the circuit board 2, making it impossible to repair or replace the device 3, and in that, since the device 3 is constructed so as to cover the terminals 2a of the circuit board 2, a wiring pattern to be connected to the terminals 2a cannot be lead onto the mounting surface of the circuit board 2, so that signals for the evaluation of the performance of the device 3 or the test of the device 3 cannot be input into and output from the device 3.

Next, a structure for mounting a device on a circuit board in the first preferred embodiment according to the invention will be explained in FIGS. 2 to 4.

Figure 2:
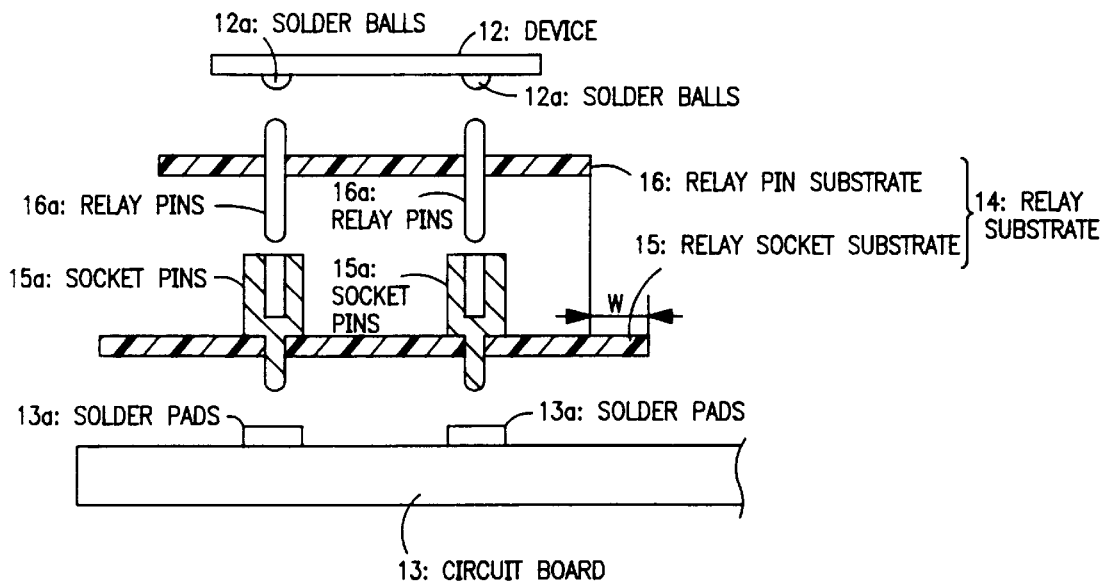
FIG. 2 is an exploded cross-sectional view of a structure for mounting a device on a circuit board according to a first preferred embodiment of the invention.
Figure 3:
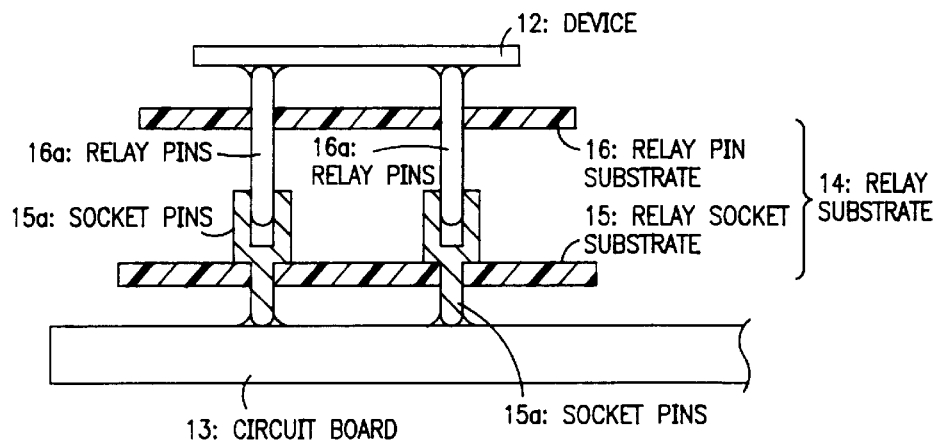
FIG. 3 is an exploded cross-sectional view of a structure for mounting a device on a circuit board according to the first preferred embodiment of the invention.
Figure 4:
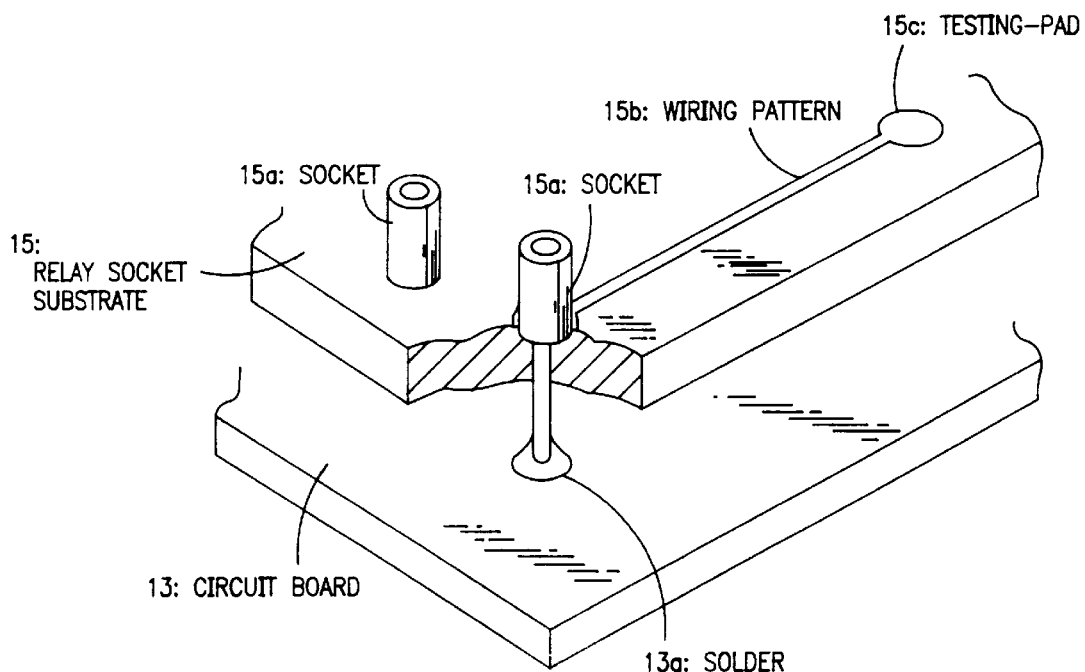
FIG. 4 is a partially perspective view of the structure for mounting a device on a circuit board according to the first embodiment of the invention.

In FIGS. 2 to 4, a structure 11 for mounting a device comprises: a device 12; a circuit board 13; and a relay substrate 14.

The device 12 comprises, for example, a BGA type LSI and has solder balls 12a as terminals. A semiconductor chip 10 is provided on the device 12, and an electrode of the semiconductor chip 10 is connected to the solder balls 12a through a lead (not shown).

The circuit board 13 comprises, for example, a printed board (a mother board) and has solder pads 13a corresponding to the solder balls 12a.

The relay substrate 14 is provided between the device 12 and the circuit board 13 and comprises a relay socket substrate 15 and a relay pin substrate 16 provided parallel to each other.

Socket pins 15a for receiving relay pins, described below, provided in the relay pin substrate 16, are inserted into and supported by the relay socket substrate 15.

A wiring pattern 15b, connected to the socket pin 15a, for permitting a signal to be input thereinto and output therefrom is provided in the relay socket substrate 15. This enables, for example, the analysis of the device 12 and, when a newly designed device is not available, enables an emulation signal to be input to carry out inspection of the operation of the circuit board 13.

The relay socket substrate 15 has testing pad 15c connected to the wiring pattern 15b. The relay socket substrate 15 is wider by W than the relay pin substrate 16, permitting easy access to the testing pad 15c in FIG. 4.

The socket pins 15a each in its one end remote from the socket are soldered to a corresponding one of terminals 13a in the circuit board 13 by a reflow process.

The relay pin substrate 16 is provided parallel to the relay socket substrate 15. An array of relay pins 16a corresponding to the array of terminals (solder balls) in the device 12 is inserted into and supported by the relay pin substrate 16.

The relay pins 16a each in its one end remote from the socket are soldered to a corresponding one of solder balls 12a in the device 12 by a reflow process, and the relay pins 16a each in its other end on the socket side are detachably fitted in a corresponding one of socket pins 15a.

In the structure for mounting a device on a circuit board, the device 12 is electrically mounted on the circuit board 13 through the relay socket substrate 15 and the relay pin substrate 16.

More specifically, when the device 12 is in the state of mounting on the circuit board 13, the relay pins 16a in the relay pin substrate 16, each in its one end remote from the other end soldered to the device 12 are fitted in a corresponding one of the socket pins 15a, in the relay socket substrate 15, on the socket side remote from the ends soldered to the circuit board 13.

Therefore, according to this preferred embodiment of the invention, after mounting of the device 12 on the circuit board 13, the device 12 can be separated from the circuit board 13 and, at the same time, a wiring pattern 15b to be connected to the socket pins 15a can be lead on the relay socket substrate 15 in its externally exposed area.

Although in the above preferred embodiment the wiring pattern is provided in the relay socket substrate 15, the invention is not limited to this embodiment only. For example, the wiring pattern may be provided in the relay pin substrate 16 or in both the relay socket substrate 15 and the relay pin substrate 16.

As described above, according to the present invention, the structure for mounting a device on a circuit board comprises two relay substrates provided parallel to each other between the circuit board and the device, one of the relay substrates being constituted by a relay socket substrate with an array of socket pins being inserted into and supported by the relay socket substrate, each of the socket pins being soldered to a corresponding one of terminals in the circuit board, the other relay substrate being constituted by a relay pin substrate with an array of relay pins, for connection to the device, being inserted into and supported by the relay pin substrate, each of the relay pins being soldered to a corresponding one of terminals in the device, the relay pins, in the relay pin substrate, each in its one end opposite to the soldered end being detachably fitted in the socket pins each in its one end on the socket side, whereby the device is mounted on the circuit board through the relay socket substrate and the relay pin substrate.

By virtue of the above construction, after mounting of the device on the circuit board, the device can be separated from the circuit board, enabling the device to be repaired or replaced.

Further, interposition of the relay substrate between the device and the circuit board permits a wiring pattern connected to the socket pins to be lead onto the relay socket substrate in its externally exposed area. This enables the device to be evaluated for performance or to be tested by using testing-pad.

The invention has been described in detail with particular reference to preferred embodiments, but it will be understood that variations and modifications can be effected within the scope of the present invention as set forth in the appended claims.

What is claimed is:

1. A structure for mounting a device on a circuit board, comprising:

a semiconductor device having an array of solder balls;

an array of first conductive members supported by a first insulative substrate, each of said first conductive members having a first end connected to a corresponding one of said solder balls;

an array of second conductive members supported by a second insulative substrate, each of first ends of second conductive members being connected to a corresponding one of second ends of said first conductive members in accordance with a connectable and deconnectable structure; and a printed circuit board having an array of solder pads, each of second ends of said second conductive members being connected to a corresponding one of said solder pads.

2. The structure, as defined in claim 1, wherein:

said second insulative substrate is parallel to said first insulative substrate, and wider than said first insulative substrate to provide an exposed region, said exposed region having a lead pattern and a terminal to be connected to an external circuit.

3. The structure, as defined in claim 1, wherein:

said connectable and deconnectable structure comprises male terminals provided at said second ends of said first conductive members, and female terminals provided at said first ends of said second conductive members.

4. The structure, as defined in claim 1, wherein:

said arrays of said solder balls, said first and second conductive members, and said solder pads have the same pattern and size relative to each other.

* * * * *